(12) United States Patent
Byun et al.

(10) Patent No.: US 8,882,330 B2
(45) Date of Patent: Nov. 11, 2014

(54) LIGHT MODULE HAVING A BENT PORTION BETWEEN LIGHT SOURCES

(75) Inventors: Sang-Chul Byun, Anyang-si (KR); Seok Hyun Nam, Seoul (KR); Si Joon Song, Suwon-si (KR); Yong Suk Chi, Seoul (KR); Min-Young Song, Asan-si (KR); Young-Keun Lee, Cheonan-si (KR); Hyuk-Hwan Kim, Asan-si (KR); Dong Hyeon Lee, Seoul (KR)

(73) Assignee: Samsung Display Co., Ltd. (KR)

( * ) Notice: Subject to any disclaimer, the term of this patent is extended or adjusted under 35 U.S.C. 154(b) by 84 days.

(21) Appl. No.: 13/525,167

(22) Filed: Jun. 15, 2012

(65) Prior Publication Data

US 2013/0077348 A1    Mar. 28, 2013

(30) Foreign Application Priority Data

Sep. 27, 2011  (KR) .................. 10-2011-0097611

(51) Int. Cl.
  *G02B 6/43*    (2006.01)
  *F21V 8/00*    (2006.01)
  *G02F 1/1335*  (2006.01)
  *F21V 19/00*   (2006.01)
  *F21S 8/00*    (2006.01)
  *F21V 23/00*   (2006.01)

(52) U.S. Cl.
  CPC ............... *F21S 8/00* (2013.01); *G02B 6/0083* (2013.01); *G02F 1/133615* (2013.01); *F21V 19/00* (2013.01); *F21V 23/00* (2013.01); *F21V 23/001* (2013.01)
  USPC ................. 362/631; 362/613; 362/249.04

(58) Field of Classification Search
  CPC ......... F21V 8/00; F21V 21/00; F21V 23/001; F21V 19/00; F21V 23/00; G02F 1/133615; G02B 6/0083
  USPC ........... 362/97, 217, 219, 225, 249, 294, 600, 362/612, 613, 97.1, 218, 249.01–249.06, 362/630, 631; 349/65, 56; 174/250–268
  See application file for complete search history.

(56) References Cited

U.S. PATENT DOCUMENTS 6,619,831 B2 *  9/2003  Kanesaka ............... 362/555
6,659,623 B2 * 12/2003  Friend ................. 362/249.06

(Continued)

FOREIGN PATENT DOCUMENTS

JP   2008-085070 A   4/2008
JP   2010-129685 A   6/2010

(Continued)

*Primary Examiner* — Alan Cariaso
*Assistant Examiner* — Arman B Fallahkhair
(74) *Attorney, Agent, or Firm* — Innovation Counsel LLP

(57) ABSTRACT

A light module for a backlight assembly that prevents metal wiring from being damaged at a bent portion and a backlight assembly including the same are presented. The light module for the backlight assembly includes: a printed circuit board (PCB) including a first portion and a second portion connected by a connection having a bend; a first light source formed on the first portion of the printed circuit board (PCB); a second light source formed on the second portion of the printed circuit board (PCB); a first wiring connecting member connected to the first light source and formed on the first portion; and a second wiring connecting member connected to the second light source and formed on the second portion, wherein the first wiring connecting member and the second wiring connecting member are connected to each other.

19 Claims, 11 Drawing Sheets

(56) References Cited

U.S. PATENT DOCUMENTS

| | | | |
|---|---|---|---|
| 6,726,502 B1* | 4/2004 | Hayes | 439/422 |
| 6,913,366 B2* | 7/2005 | Lee | 362/628 |
| 7,473,022 B2* | 1/2009 | Yoo | 362/621 |
| 8,289,478 B2* | 10/2012 | Hamada | 349/65 |
| 8,360,608 B2* | 1/2013 | Wildner | 362/249.04 |
| 8,475,000 B2* | 7/2013 | Tamai | 362/249.04 |
| 8,506,151 B2* | 8/2013 | Park | 362/613 |
| 2007/0177405 A1* | 8/2007 | Chan et al. | 362/613 |
| 2007/0277998 A1 | 12/2007 | Suzuki et al. | |
| 2007/0281499 A1 | 12/2007 | Muro et al. | |
| 2013/0010233 A1* | 1/2013 | Seo et al. | 349/65 |
| 2013/0039093 A1* | 2/2013 | Song et al. | 362/613 |
| 2013/0141941 A1* | 6/2013 | Matsui | 362/612 |
| 2013/0163279 A1* | 6/2013 | Peng et al. | 362/609 |

FOREIGN PATENT DOCUMENTS

| | | |
|---|---|---|
| KR | 2005-235997 A | 9/2005 |
| KR | 10-0699438 B | 3/2007 |
| KR | 2007-242716 A | 9/2007 |
| KR | 10-0875724 B1 | 12/2008 |
| KR | 2010-034174 A | 2/2010 |

* cited by examiner

LIGHT MODULE HAVING A BENT PORTION BETWEEN LIGHT SOURCES

CROSS-REFERENCE TO RELATED APPLICATION

This application claims priority to and the benefit of Korean Patent Application No. 10-2011-0097611 filed in the Korean Intellectual Property Office on Sep. 27, 2011, the entire contents of which are incorporated herein by reference.

BACKGROUND OF THE INVENTION (a) Field of the Invention

The present invention relates to a light module for a backlight assembly and a backlight assembly including the same. More particularly, the present invention relates to a light module having a bent portion and a backlight assembly including the same.

(b) Description of the Related Art

Display devices are ubiquitous today, as they are used for many electronics such as computer monitors, televisions, mobile phones, and the like. Display devices include cathode ray tubes, liquid crystal displays, and plasma display devices, among others.

A liquid crystal display panel, which is one of the more common types of flat panel displays today, includes two sheets of display panels with field generating electrodes such as a pixel electrode and a common electrode and a liquid crystal layer interposed therebetween. The liquid crystal display generates electric fields in the liquid crystal layer by applying a voltage to the field generating electrodes, determines the alignment of liquid crystal molecules of the liquid crystal layer by the generated electric field, and controls polarization of incident light, thereby displaying images.

Since the liquid crystal display does not self-emit light, the liquid crystal display often needs a light module. In this case, the light module may be an artificial light module provided separately or natural light. When using an artificial light module, a light guide plate (LGP) is used so that the generated light having uniform luminance reaches the entire display panel.

The artificial light module used in the liquid crystal display includes a light emitting diode (LED), a cold cathode fluorescent lamp (CCFL), an external electrode fluorescent lamp (EEFL), and the like.

Recently, light emitting diodes are widely used because of advantages such as long life span, small size, low power consumption as compared with other light modules. In the case where multiple light emitting diodes are disposed on a printed circuit board (PCB) to form a light module and used as a light module, the light emitting diodes may be laid out in many different ways.

To arrange a plurality of light emitting diodes (LEDs) such that their light emission surfaces are oriented in the desired way, the light emitting diodes are combined with, and arranged on, a printed circuit board (PCB). However, as the number of printed circuit boards (PCB) increases, the cost of a display device that includes the PCBs increases and the manufacturing process becomes more complicated.

Accordingly, bending a printed circuit board (PCB) has been proposed as a solution. However, when a PCB is bent, the metal wiring formed at the bent portion may be damaged.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention relates to a light module for a backlight assembly including a printed circuit board (PCB) with a bent shape to arrange a plurality of light emitting diodes (LED) with a predetermined angle, and a backlight assembly including the same.

Also, the present invention relates to a light module for a backlight assembly that prevents metal wiring from being damaged at a bent portion of the printed circuit board (PCB), and a backlight assembly including the same.

According to one aspect of the invention, a light module for a backlight assembly includes: a printed circuit board (PCB) including a first portion and a second portion connected by a connection having a bend; a first light source formed on the first portion of the printed circuit board (PCB); a second light source formed on the second portion of the printed circuit board (PCB); a first wiring connecting member connected to the first light source and formed on the first portion; and a second wiring connecting member connected to the second light source and formed on the second portion, wherein the first wiring connecting member and the second wiring connecting member are connected to each other.

The first portion may further include a first protrusion protruding from an edge of the first portion, and the second portion may further include a second protrusion protruding from an edge of the second portion.

The first wiring connecting member may be formed on the first protrusion, and the second wiring connecting member may be formed on the second protrusion.

The printed circuit board (PCB) may further include a first space formed between the first protrusion and the connection, and a second space formed between the second protrusion and the connection.

The light module may further include a first wiring connecting the first light source and the first wiring connecting member, and a second wiring connecting the second light source and the second wiring connecting member.

The second wiring connecting member may further include at least one protruding terminal protruded from one side surface of the second wiring connecting member, and the first wiring connecting member may include at least one groove such that the protruding terminal is inserted into one side surface of the first wiring connecting member.

An assistance connecting member connecting the first wiring connecting member and the second wiring connecting member may be further included.

The assistance connecting member may be made of one of a connector, a wire, and a harness.

The first wiring connecting member and the second wiring connecting member may be integrally formed.

The first wiring connecting member and the second wiring connecting member may be made of a flexible flat cable.

The first light source and the second light source may be made of a light emitting diode (LED).

An angle between the first portion and the second portion may be more than 100 degrees and less than 150 degrees.

The first light source and the second light source may constitute more than 10% of the combined number of the first light source and the second light source.

A backlight assembly according to an exemplary embodiment of the present invention includes: a light guide plate including a cutout portion of which a corner portion of at least one side is cut in an oblique direction with respect to one side edge; and a light module positioned to face one side edge of the light guide plate and the cutout portion of the light guide plate. The light module includes: a printed circuit board (PCB) including a first portion, a second portion, and a connection connecting one side edge of the first portion and one side edge of the second portion; a first light source formed on the first portion of the printed circuit board (PCB); a second light source formed on the second portion of the printed circuit board (PCB); a first wiring connecting member connected to the first light source and formed on the first portion; and a second wiring connecting member connected to the second light source and formed on the second portion, wherein the first portion of the printed circuit board (PCB) is positioned to face one side edge of the light guide plate, the second portion of the printed circuit board (PCB) is positioned to face the cutout portion of the light guide plate and the first wiring connecting member and the second wiring connecting member are connected to each other.

The first portion may further include a first protrusion protruding from an edge of the first portion, and the second portion may further include a second protrusion protruding from an edge of the second portion.

The first wiring connecting member may be formed on the first protrusion, and the second wiring connecting member may be formed on the second protrusion.

The printed circuit board (PCB) may further include a first space formed between the first protrusion and the connection, and a second space formed between the second protrusion and the connection.

The first wiring connecting member may further include at least one protruding terminal protruded from one side surface of the first wiring connecting member, and the second wiring connecting member may include at least one groove such that the protruding terminal is inserted into one side surface of the second wiring connecting member.

An assistance connecting member connecting the first wiring connecting member and the second wiring connecting member may be further included, and the assistance connecting member may be made of one of a connector, a wire, and a harness.

The first wiring connecting member and the second wiring connecting member may be integrally made of a flexible flat cable.

The light module for the backlight assembly according to an exemplary embodiment of the present invention and the backlight assembly including the same have effects as follows.

In the present invention, the connection connecting the first portion and the second portion of the printed circuit board (PCB) is formed with the bent shape, the first light source is formed at the first portion, and the second light source is formed at the second portion, and thereby the first light source and the second light source are disposed with a predetermined the angle.

Also, the first wiring connecting member connected to the first light source and the second wiring connecting member connected to the second light source are formed for connection thereof such that damage to the metal wiring may be prevented while forming the printed circuit board (PCB) with the bent shape.

DETAILED DESCRIPTION OF THE EMBODIMENTS

Figure 1:
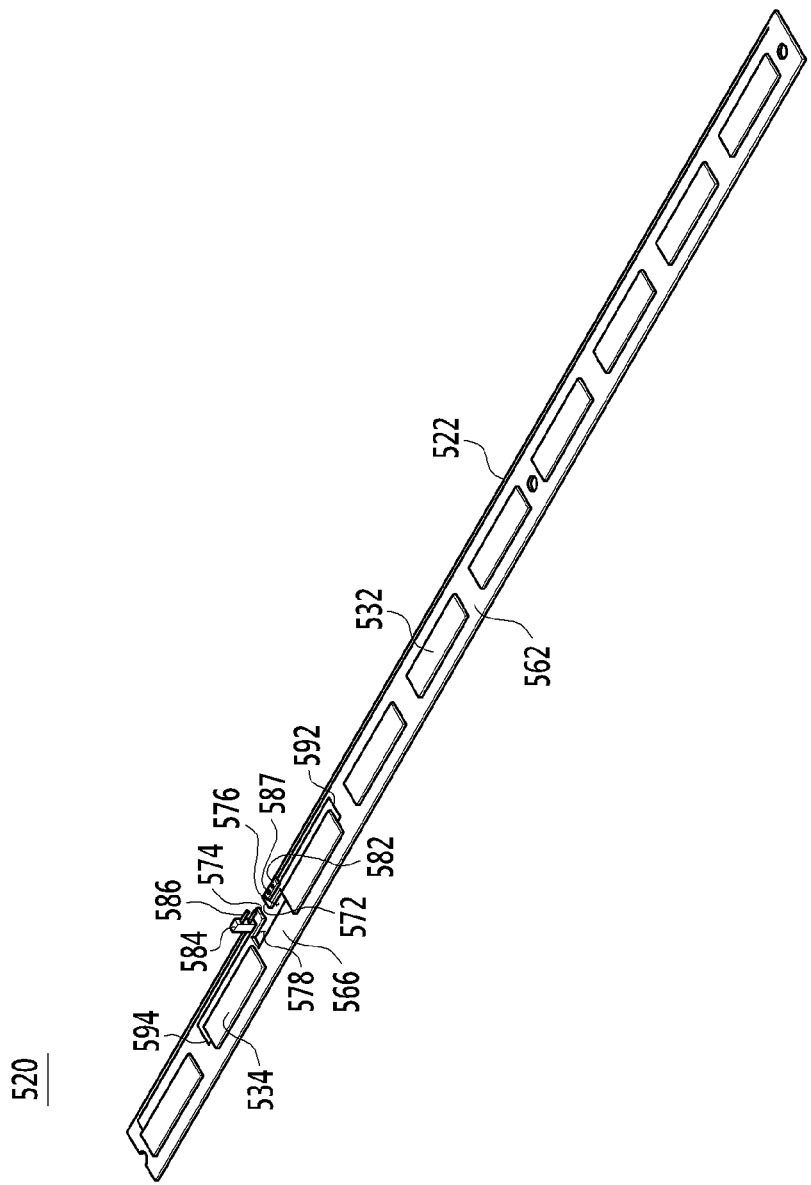
FIG. 1 and FIG. 2 are perspective views of a light module for a backlight assembly according to the first exemplary embodiment of the present invention.

The present invention will be described more fully hereinafter with reference to the accompanying drawings, in which exemplary embodiments of the invention are shown. As those skilled in the art would realize, the described embodiments may be modified in various ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Firstly, a light module for a backlight assembly according to the first exemplary embodiment of the present invention will be described with reference to accompanying drawings.

Figure 2:
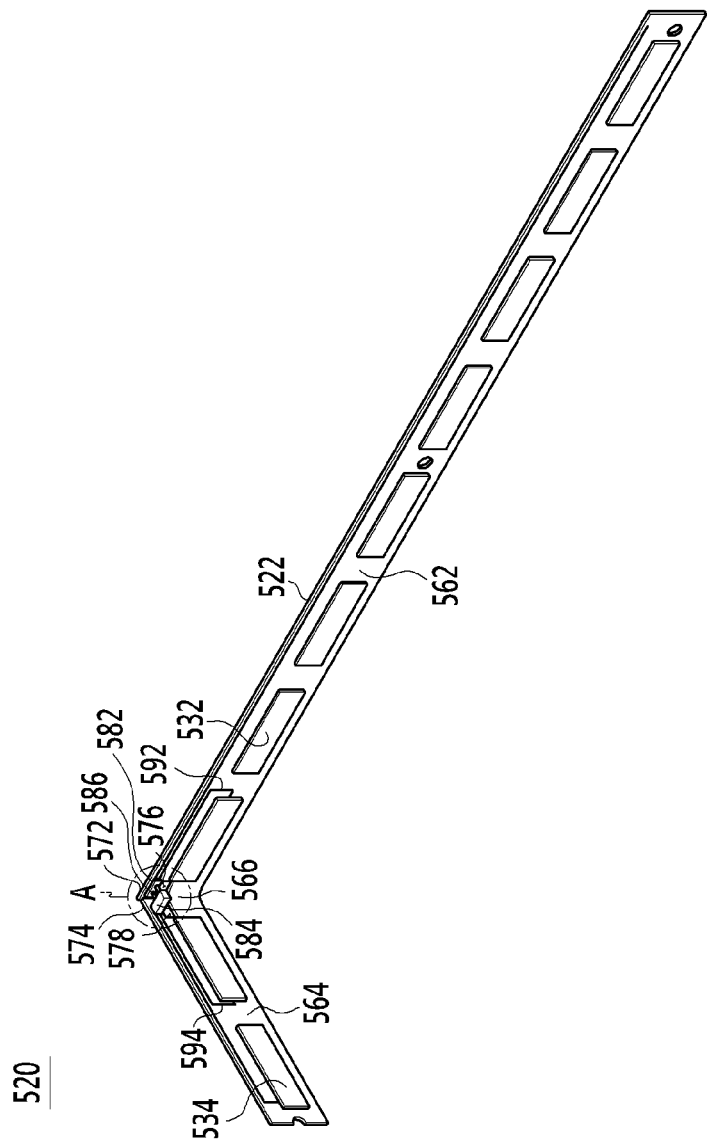
Figure 3:
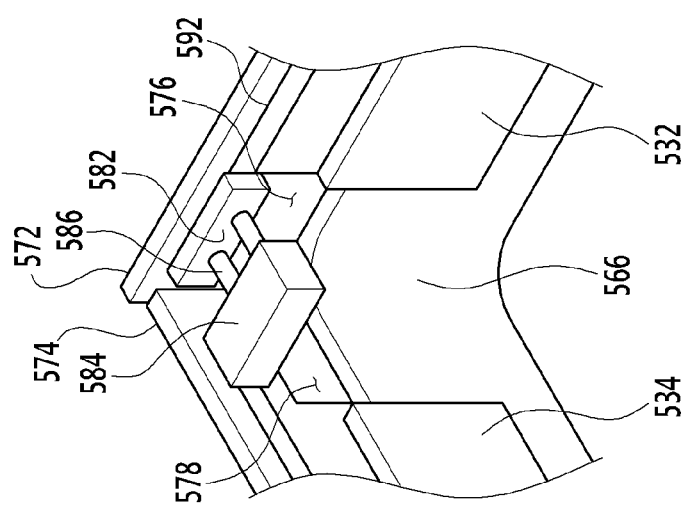
FIG. 3 is an enlarged perspective view of a portion A of FIG. 2 in a light module for a backlight assembly according to the first exemplary embodiment of the present invention.

FIG. 1 and FIG. 2 are perspective views of a light module for a backlight assembly according to the first exemplary embodiment of the present invention, and FIG. 3 is an enlarged perspective view of a portion A of FIG. 2 in a light module for a backlight assembly according to the first exemplary embodiment of the present invention. FIG. 1 is a view before the light module is bent, and FIG. 2 and FIG. 3 are views after the light module is bent.

The light module for the backlight assembly according to the first exemplary embodiment of the present invention includes a printed circuit board (PCB) 522 with a bent shape, and a first light source 532 and a second light source 534 formed on the printed circuit board (PCB) 522.

The printed circuit board (PCB) 522 includes a first portion 562, a second portion 564, and a connection 566 connecting one edge of the first portion 562 and one edge of the second portion 564.

The first portion 562 and the second portion 564 are planar portions of the printed circuit board (PCB) 522. The connection 566 connects the first portion 562 to the second portion 564.

The connection 566 has a bent shape. By controlling the bend angle of the connection 566, the angle formed by the first portion 562 and the second portion 564 may be adjusted. The bend angle of the connection 566, which is the angle formed by the first portion 562 and the second portion 564, is preferably an obtuse angle. In some embodiments, the angle formed by the first portion 562 and the second portion 564 may be more than 100 degrees and less than 150 degrees. The connection 566 connects one edge of the first portion 562 to an edge of the second portion 564.

The first portion 562 further includes a first protrusion 572 protruding from one edge of the first portion 562, and the second portion 564 further includes a second protrusion 574 protruding from one edge of the second portion 564.

A first space 576 may be formed between the first protrusion 572 and an edge of the connection 566 that is adjacent to the first portion 562. Similarly, a second space 578 may be formed between the second protrusion 574 and an edge of the connection 566 that is adjacent to the second portion 564.

The first light source 532 is formed on the first portion 562, and the second light source 534 is formed on the second portion 564. A plurality of first light sources 532 and second light sources 534 may be formed. The first light source 532 and the second light source 534 may be made of various light emission means, such as light emitting diodes (LED). The second light sources 534 may make up more than 10% of the total number of light sources 532 and 534.

A first wiring connecting member 582 connected to the first light source 532 is formed on the first portion 562 of the printed circuit board (PCB) 522. The first wiring connecting member 582 may be formed on the first protrusion 572.

A second wiring connecting member 584 connected to the second light source 534 may be formed on the second portion 564 of the printed circuit board (PCB) 522. The second wiring connecting member 584 may be formed on the second protrusion 574, as shown in FIG. 3.

The second wiring connecting member 584 may include at least one protruding terminal 586 extending from one side surface of the second wiring connecting member 584. The first wiring connecting member 582 may include at least one groove 587 on a surface of the first wiring connecting member 582 that is positioned to receive the protruding terminal 586.

Referring to FIG. 1, the protruding terminal 586 is formed to extend from the side of the second wiring connecting member 584 toward the first portion 562, and the groove 587 may be formed at the upper surface of the first wiring connecting member 582. Referring to FIG. 2 and FIG. 3, in a state that the connection 566 is bent, the protruding terminal 586 and the groove (587 of FIG. 1) may be formed at a surface where the first wiring connecting member 582 and the second wiring connecting member 584 face each other.

When the connection 566 is bent, the protruding terminal 586 is inserted into the groove 587, thereby electrically connecting the first wiring connecting member 582 and the second wiring connecting member 584. The first wiring connecting member 582 and the second wiring connecting member 584 are connected, and thereby the first light source 532 and the second light source 534 are connected to each other.

If metal wiring connecting the first light source 532 and the second light source 534 is formed at the connection 566 of the printed circuit board (PCB) 522, the metal wiring may be damaged by the bending of the connection 566. In the present exemplary embodiment, the first wiring connecting member 582 and the second wiring connecting member 584 connecting the first light source 532 and the second light source 534 are separated from the connection 566 of the bent shape such that the damage is not generated. The first and second wiring connecting members 582, 584 are electrically connected to the first and second light sources 532, 534 via first and second wirings 592, 594.

Although the figures show two protruding terminals 586, this is not a limitation of the invention. Generally, the number of protruding terminals 586 is the same as that of the grooves 587.

A first wiring 592 connecting the first light source 532 and the first wiring connecting member 582 may be further formed on the first portion 562. A second wiring 594 connecting the second light source 534 and the second wiring connecting member 584 may be further formed on the second portion 564.

Although not shown, the printed circuit board (PCB) 522 may include a driving circuit for driving the first light source 532 and the second light source 534. That is, by using the driving circuit formed in the printed circuit board (PCB) 522, on/off switching and brightness of the first light source 532 and the second light source 534 may be controlled.

In the first exemplary embodiment of the present invention, the first wiring connecting member 582 and the second wiring connecting member 584 are formed separately from the connection 566 to minimize the risk of damage to the metal wiring connecting the first light source 532 and the second light source 534 upon bending of the connection 566. Another structure in which the first wiring connecting member 582 and the second wiring connecting member 584 are separated from the connection 566 will be described through the second exemplary embodiment and the third exemplary embodiment.

Next, a light module for a backlight assembly according to the second exemplary embodiment of the present invention will be described with reference to accompanying drawings.

A main difference between the first and the second embodiments lies in how the first wiring connecting member 582 and the second wiring connecting member 584 are connected.

Figure 4:
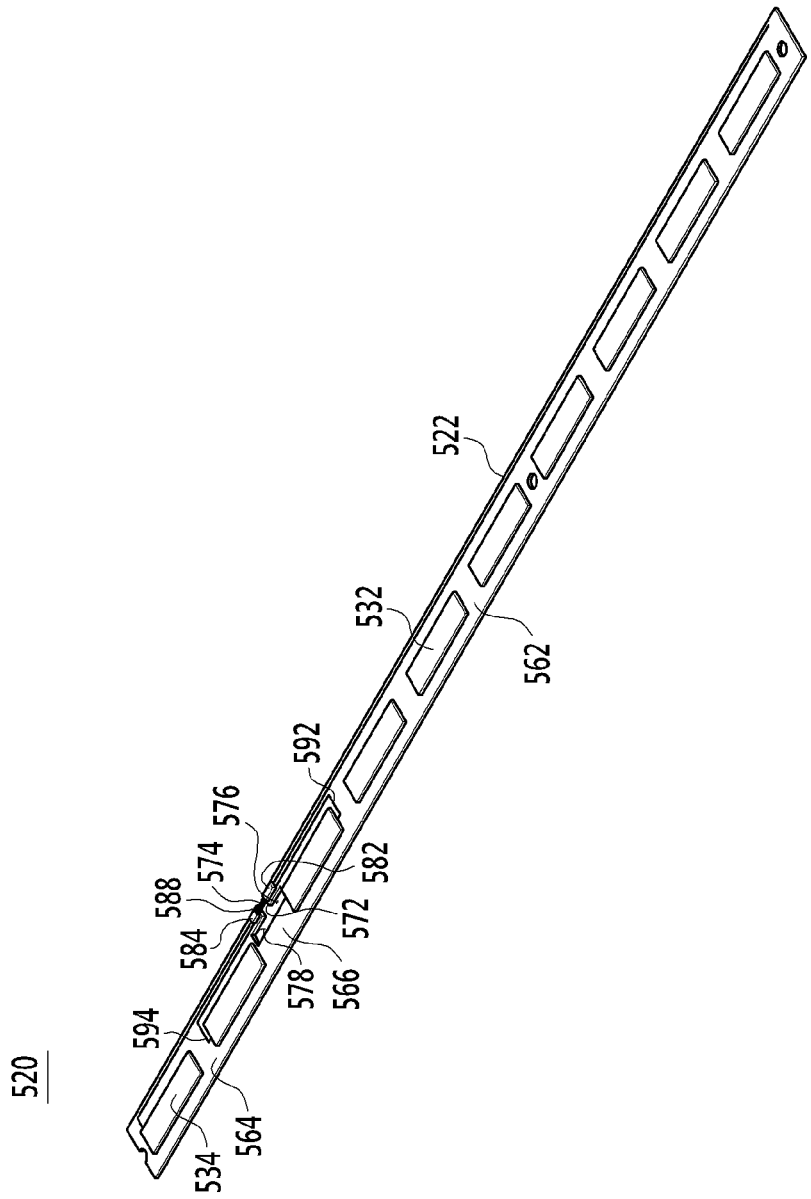
FIG. 4 and FIG. 5 are perspective views of a light module for a backlight assembly according to the second exemplary embodiment of the present invention.
Figure 5:
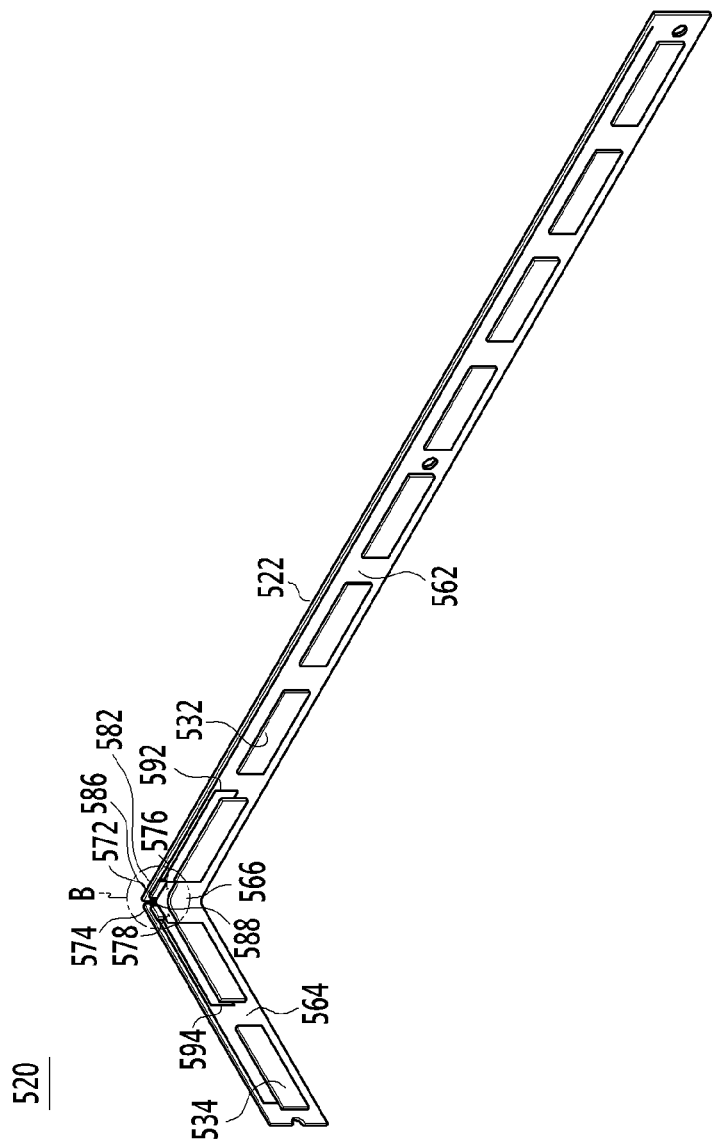
Figure 6:
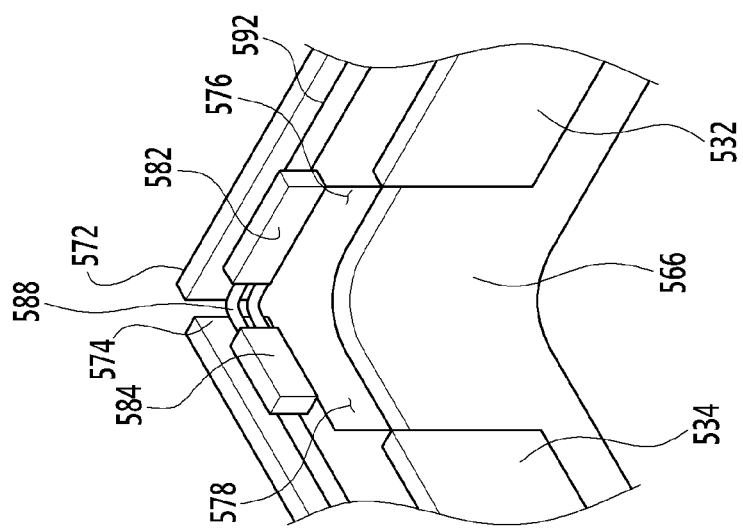
FIG. 6 is an enlarged perspective view of a portion B of FIG. 5 in a light module for a backlight assembly according to the second exemplary embodiment of the present invention.

FIG. 4 and FIG. 5 are perspective views of a light module for a backlight assembly according to the second exemplary embodiment of the present invention, and FIG. 6 is an enlarged perspective view of a portion B of FIG. 5 in a light module for a backlight assembly according to the second exemplary embodiment of the present invention. FIG. 4 is a view before a connection is bent, and FIG. 5 and FIG. 6 are views after the connection is bent.

A light module for a backlight assembly according to the second exemplary embodiment of the present invention, as shown in FIG. 4, includes a printed circuit board (PCB) 522 with the bent shape, and the first light source 532 and the second light source 534 formed on the printed circuit board (PCB) 522, like the first exemplary embodiment.

The first wiring connecting member 582 connected to the first light source 532 is formed on the first portion 562 of the printed circuit board (PCB) 522. The first wiring connecting member 582 may be formed on the first protrusion 572.

The second wiring connecting member 584 connected to the second light source 534 is formed on the second portion 564 of the printed circuit board (PCB) 522. The second wiring connecting member 584 may be formed on the second protrusion 574.

The light module for the backlight assembly according to the second exemplary embodiment of the present invention may further include an assistance connecting member 588 connecting the first wiring connecting member 582 and the second wiring connecting member 584. A plurality of assistance connecting members 588 may be formed, and while two assistance connecting members 588 are formed in the drawing, it is not limited thereto.

The assistance connecting member 588 electrically connects the first wiring connecting member 582 and the second wiring connecting member 584, and may be made of a flexible material. For example, it may be made of a connector, a wire, or a harness.

A harness is a bundle of insulated electrical wires having various lengths respectively formed of small wires to be directly connected to a predetermined device, is formed with terminals, and is sometimes referred to as a wiring harness. The harness includes conductive members and coat members made of an insulator enclosing and coating the conductive members. The conductive member and the coat member may be made in plural, and a member enclosing and binding a plurality of conductive members and coat members into one bundle may be further included.

That is, the assistance connecting member 588 may be formed in plural to connect the first wiring connecting member 582 and the second wiring connecting member 584, and they may be formed of a plurality of separated wires. A plurality of wires may be twisted such that the assistance connecting member 588 is formed as the harness grouping a plurality of wires as one bundle, thereby preventing the above problem.

The outer surface of the assistance connecting member 588 is formed to enclose the insulator such that it may not be damaged from the outside.

Next, a light module for a backlight assembly according to the third exemplary embodiment of the present invention will be described with reference to accompanying drawings.

A main difference between the third embodiment and the first exemplary embodiment lies in how the first wiring connecting member 582 and the second wiring connecting member 584 are connected, and this will be described in detail.

Figure 7:
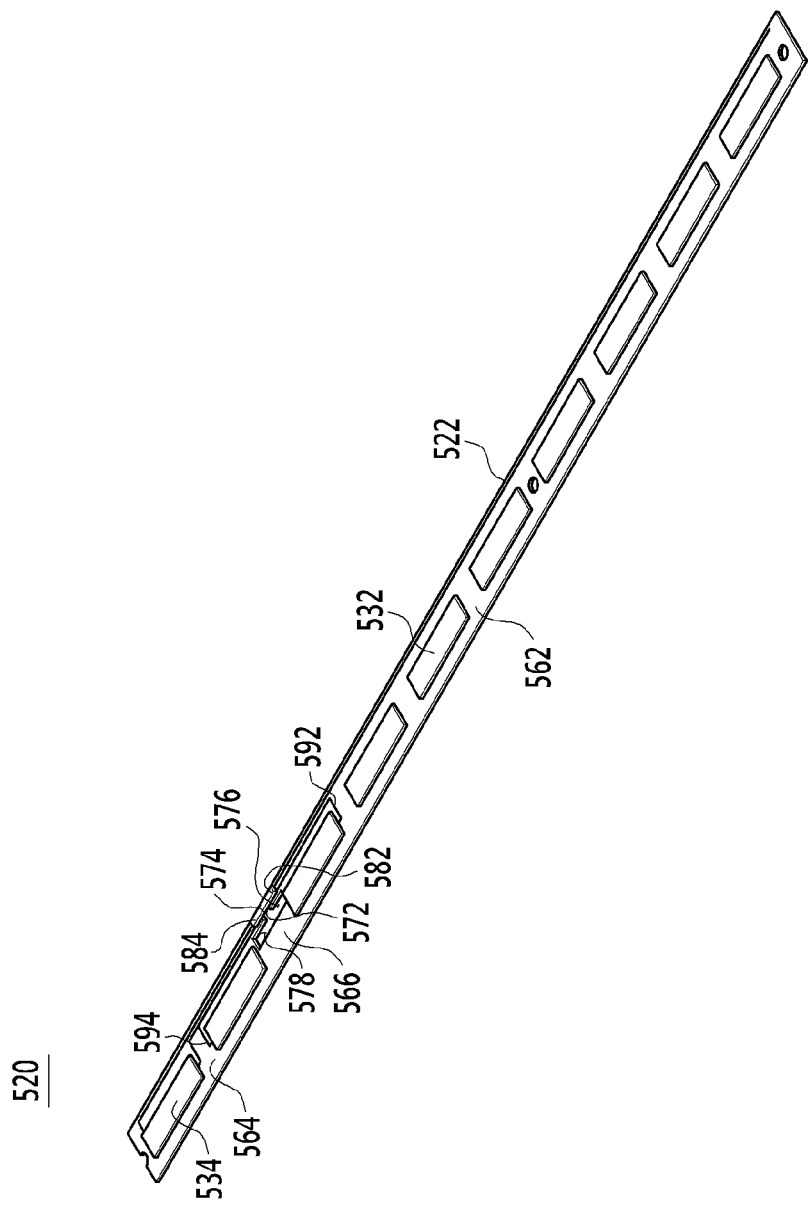
FIG. 7 and FIG. 8 are perspective views of a light module for a backlight assembly according to the third exemplary embodiment of the present invention.
Figure 8:
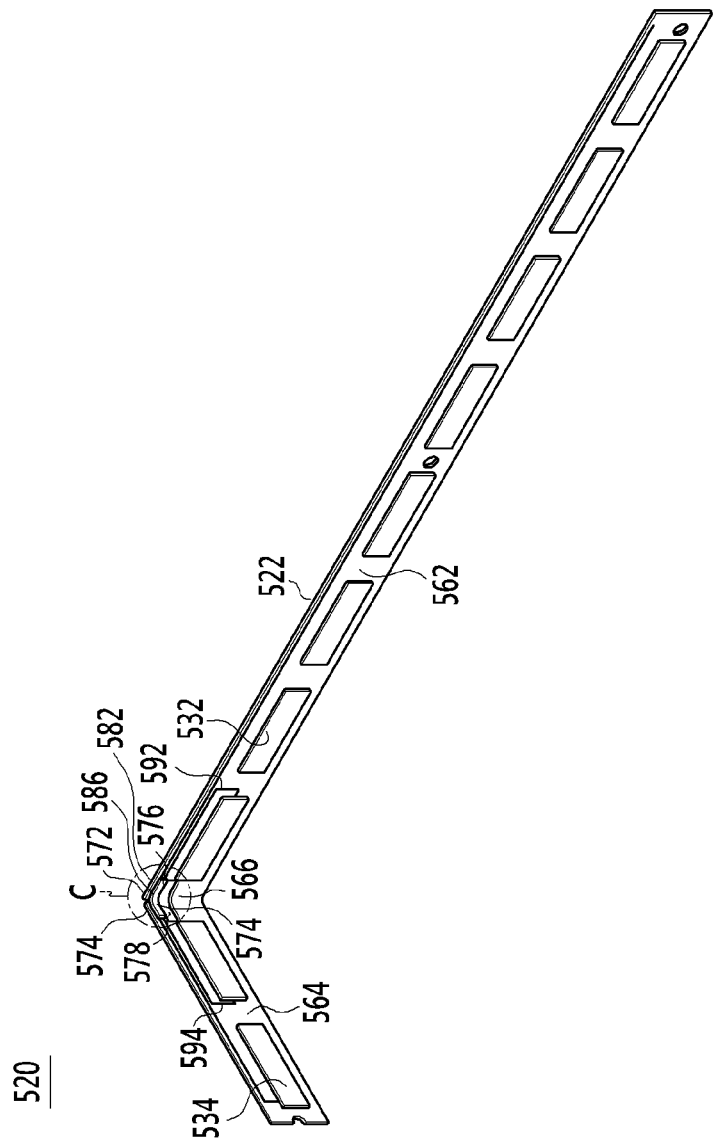
Figure 9:
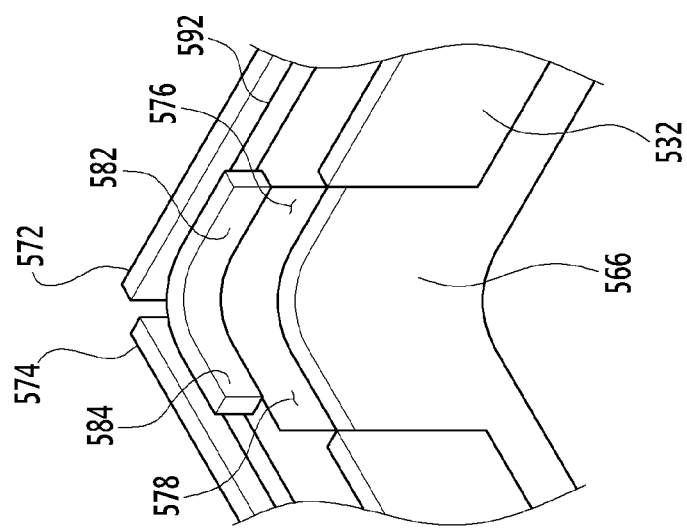
FIG. 9 is an enlarged perspective view of a portion C of FIG. 5 in a light module for a backlight assembly according to the third exemplary embodiment of the present invention.

FIG. 7 and FIG. 8 are perspective views of a light module for a backlight assembly according to the third exemplary embodiment of the present invention, and FIG. 9 is an enlarged perspective view of a portion C of FIG. 5 in a light module for a backlight assembly according to the third exemplary embodiment of the present invention. FIG. 7 is a view before a connection is bent, and FIG. 8 and FIG. 9 are views after a connection is bent.

The light module for the backlight assembly according to the third exemplary embodiment of the present invention includes, as shown in FIG. 7, the printed circuit board (PCB) 522 with the bent shape, and the first light source 532 and the second light source 534 formed on the printed circuit board (PCB) 522, like the first exemplary embodiment.

The first wiring connecting member 582 connected to the first light source 532 is formed on the first portion 562 of the printed circuit board (PCB) 522. The first wiring connecting member 582 may be formed to be attached on the first protrusion 572.

The second wiring connecting member 584 connected to the second light source 534 is formed on the second portion 564 of the printed circuit board (PCB) 522. The second wiring connecting member 584 may be formed to be attached on the second protrusion 574.

The first wiring connecting member 582 and the second wiring connecting member 584 are integrally formed. In the embodiment illustrated in FIG. 9, the first wiring connecting member 582 and the second wiring connecting member 584 are seamlessly integrated into a single structural piece. The first and second wiring connecting member 582 and 584 that are integrally formed may electrically connect the first light source 532 and the second light source 534. The first and second wiring connecting member 582 and 584 may be made of a flexible material. Also, the first and second wiring connecting members 582 and 584 may be made in a flat plane shape. For example, they may be made of a flexible flat cable (FFC).

The outer surface of the first and second wiring connecting members 582 and 584 is formed to be enclosed with the insulator such that it is not damaged from the outside.

In the embodiments shown above, the electrical connection between the first light sources and the second light sources are established through the first and second wiring connecting members, not through wires built into the PCB. Hence, even if the PCB is bent, reliability of the electrical connection between the light sources is not compromised.

A backlight assembly including the light module for the backlight assembly according to an exemplary embodiment of the present invention will now be described.

Figure 10:
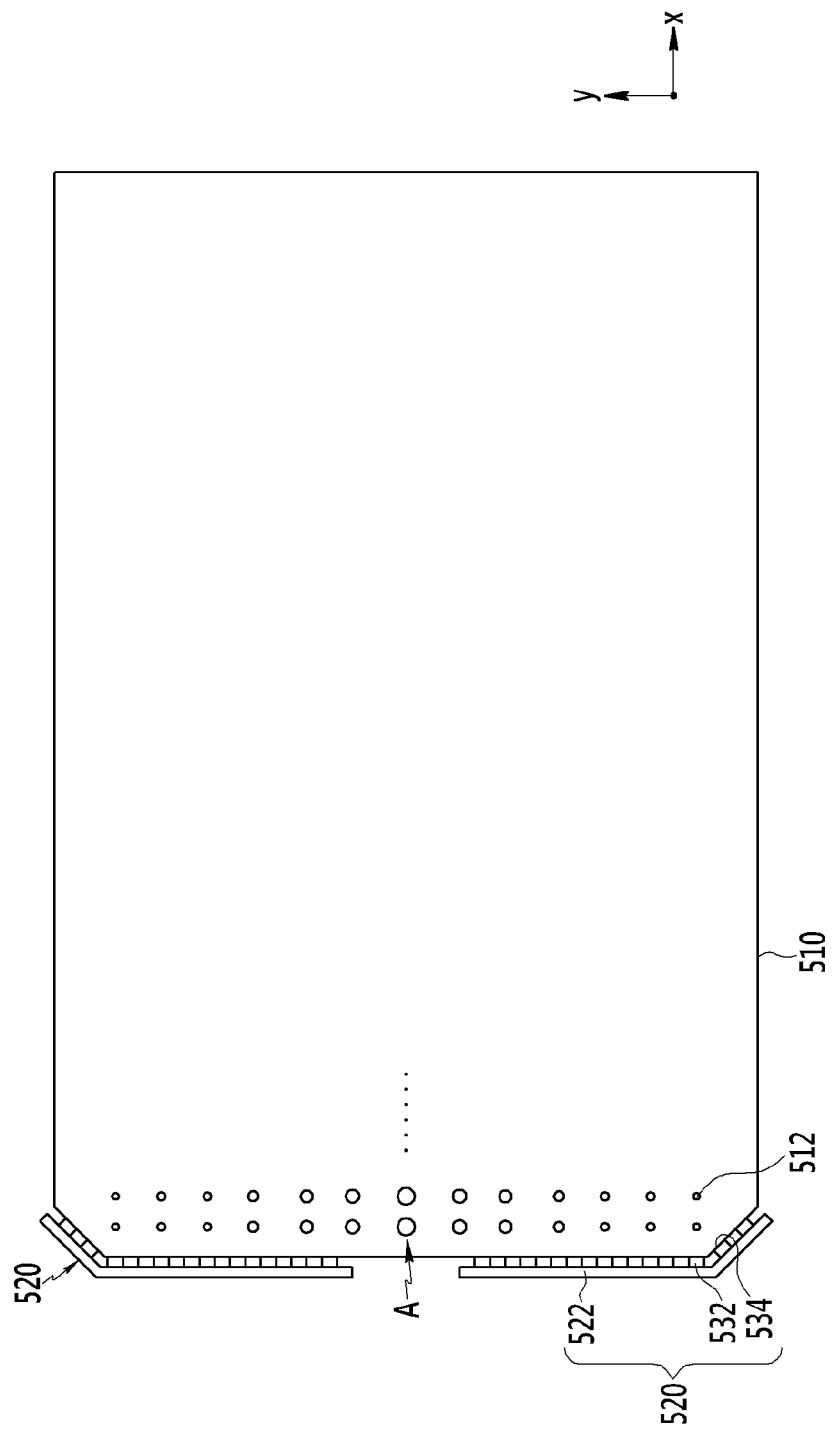
FIG. 10 is a top plan view of a backlight assembly according to an exemplary embodiment of the present invention.

FIG. 10 is a top plan view of a backlight assembly according to an exemplary embodiment of the present invention.

As shown in FIG. 10, a backlight assembly according to an exemplary embodiment of the present invention includes a light guide plate 510 including a cutout portion. A corner portion is cut in an oblique direction with respect to one side edge, and the light module 520 is positioned to face one side edge and the cutout surface of the light guide plate 510.

The light guide plate 510 may have a rectangular shape and the cutout portion may be formed at one corner portion among four corner portions of the rectangle. An angle between one side edge and the cutout surface of the light guide plate 510 may be in the range of more than 100 degrees and less than 150 degrees.

As shown, the cutout portion may be formed at two neighboring corner portions. That is, the cutout portion may be formed at two corner portions positioned at the ends of one side edge. The light guide plate 510 may be made with the rectangular shape including a short edge and a long edge, and it is preferable that the cutout portion is formed at two corner portions positioned at the ends of a short edge. Also, it is preferable that the two cutout portions are symmetrical to each other with respect to an axis that bisects the shared side.

A plurality of light collection patterns 512 may be formed on the lower surface of the light guide plate 510. The light collection patterns 512 have a function of increasing light collection efficiency such that the light emitted to the upper surface of the light guide plate 510 is increased. The light collection patterns 512 may be any suitable structure including but not limited to bumps, prisms, and holes.

The light collection patterns 512 may have a dot shape and may have different sizes. As the size of the light collection patterns 512 is increased, the light collection efficiency is increased. Accordingly, sizes of the collecting patterns 512 may vary such that they are larger at a place where less of the light from the light module 512 reaches. The light collection patterns 512 may be formed in the direction parallel to a side edge of the light guide plate 510. The light collection pattern 512 positioned at a column closest to one side edge of the light guide plate 510 may be formed to be larger moving further away from the light module 520. The light collection pattern 512 positioned at position A where a light amount is lowest is formed to be largest, and the sizes of the light collection pattern 512 gradually decrease with distance from the position A. Thus, the light may be uniformly distributed.

The light module 520 may be the light module for the backlight assembly according to the first to third exemplary embodiments of the present invention.

As shown in FIG. 10, the first light source 532 is positioned to face one side edge of the light guide plate 510 and the second light source 534 is positioned to face the cutout portion of the light guide plate 510. The printed circuit board (PCB) 522 is formed with the bent shape, and thereby the first light source 532 and the second light source 534 formed thereon may be disposed with a predetermined angle.

The first light source 532 is positioned at one side edge of the light guide plate 510, particularly at a position close to the cutout portion, and multiple first light sources 532 may be formed. The shape and number of first light sources 532 closer to the cutout portion formed at one end of one side edge of the light guide plate 510 and the first light sources 532 close to the cutout portion formed at the other end of one side edge of the light guide plate 510 may be formed to be symmetrical to each other. For example, as shown in FIG. 2, eight first light sources 532 are disposed at the upper side of the left edge of the light guide plate 510 and eight first light sources 532 are disposed at the lower side. A first light source 532 is not disposed at the center of one side edge of the light guide plate 510.

It is preferable that the emission surface of the first light source 532 is formed to contract one side edge of the light guide plate 510, thereby reducing the loss of light. The light emitted from the first light source 532 is uniformly distributed from one side edge of the light guide plate 510 to the opposite side edge.

The second light source 534 is disposed at the cutout portion of the light guide plate 510. The shape and number of second light sources 534 closer to the cutout portion formed at one end of one side edge of the light guide plate 510 and second light sources 534 closer to the cutout portion formed at the other end of one side edge of the light guide plate 510 may be formed to be symmetrical to each other. For example, two second light source 534 are formed at the cutout portion positioned at the upper end of the left edge of the light guide plate 510, and two second light source 534 are formed at the cutout portion positioned at the lower end.

It is preferable that the light emission surface of the second light source 534 contacts the cutout surface of the light guide plate 510, thereby reducing the loss of light. The "cutout surface," as used herein, is the surface of the cutout portion that forms an oblique angle with respect to the longer sides of the light guide plate 510. When only the first light source 532 exists, the light does not reach position A. The light from the second light source 534 reaches position A.

It is preferable that the angle between the emission surface of the first light source 532 and the emission surface of the second light source 534 is in the range of more than 100 degrees and less than 150 degrees. The light emitted from the first light source 532 and the light emitted from the second light source 534 are incident inside the light guide plate 510 with the above angle such that the light uniformly reaches the entire upper surface of the light guide plate 510.

The printed circuit board (PCB) 522 has the short edge and the long edge, and the length of the short edge corresponds to the length of the cutout portion of the light guide plate 510.

The first light source 532 is disposed at the long edge of the printed circuit board (PCB) 522 and the second light source 534 is disposed at the short edge. By controlling the bend angle of the printed circuit board (PCB) 522, the angle between the emission surface of the first light source 532 and the emission surface of the second light source 534 may be determined. Accordingly, it is preferable that the bend angle of the printed circuit board (PCB) 522 may be more than 100 degrees and less than 150 degrees.

Next, a liquid crystal display including the backlight assembly will be described.

Figure 11:
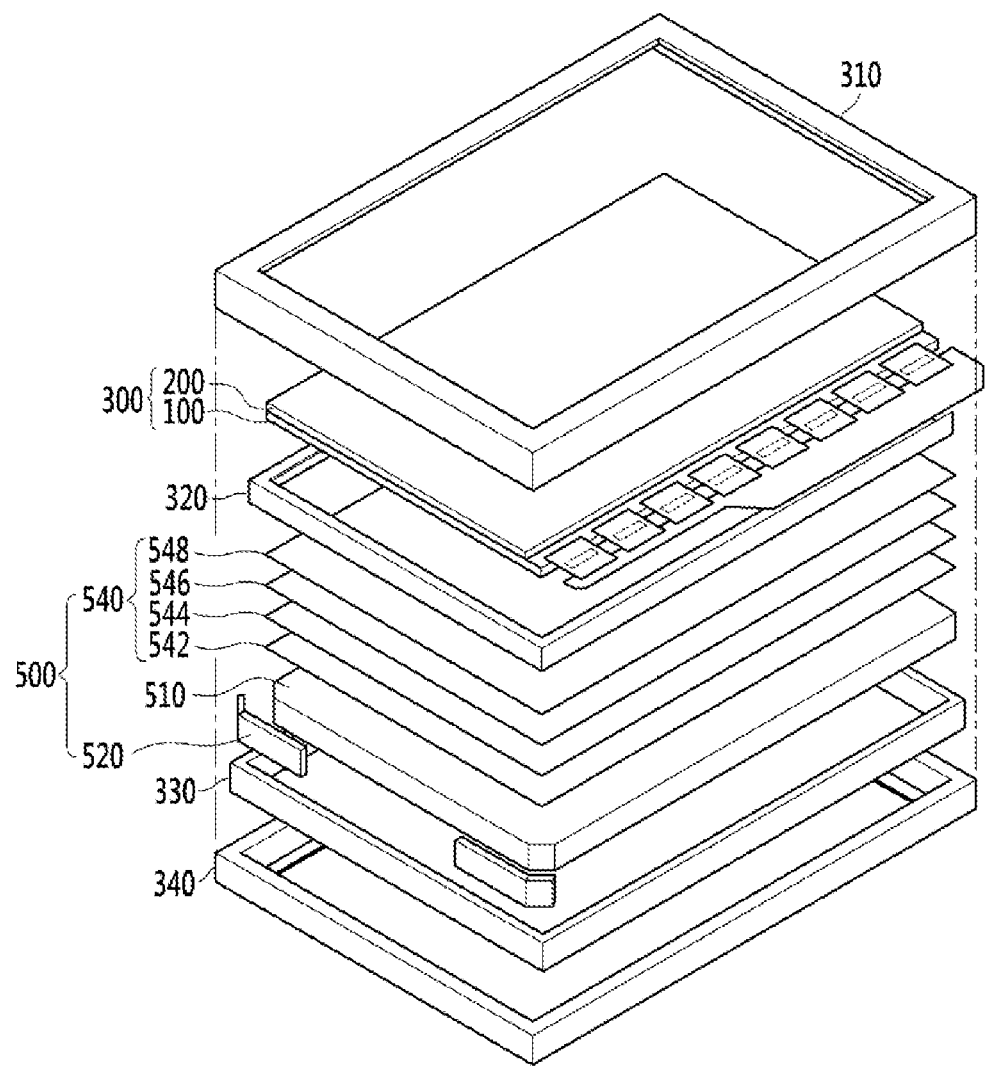
FIG. 11 is an exploded perspective view of a liquid crystal display including a backlight assembly according to an exemplary embodiment of the present invention.

FIG. 11 is an exploded perspective view of a liquid crystal display including a backlight assembly according to an exemplary embodiment of the present invention.

As shown in FIG. 11, the liquid crystal display including the backlight assembly according to an exemplary embodiment of the present invention includes a backlight assembly 500 supplying light and a liquid crystal panel 300 displaying the images by receiving the light from the backlight assembly 500. Also, to fix the backlight assembly 500 and the liquid crystal panel 300, a top chassis 310, an upper mold frame 320, a lower mold frame 330, and a bottom chassis 340 are combined.

The backlight assembly 500 includes a light module 520 supplying light, a light guide plate 510 receiving the light from the light module 520 to transmit the light to an upper surface, and an optical sheet 540 disposed on the light guide plate 510.

The light module 520 includes a plurality of light emitting members generating light, and is disposed so as to face a side of the light guide plate 510 to supply the light to the side of the light guide plate 510.

The light guide plate 510 receives the light on the side from the light module 520 to transmit the light to the upper surface. In this case, a thickness of the light guide plate 510 is the thickest at a portion adjacent to the light module unit 520 and gradually becomes thinner further away from the light module 520 so that light can be uniformly distributed from a point near the light module 520 to a point far from the light module 520. In this case, the upper surface of the light guide plate 510 is parallel to the liquid crystal panel 300 and the lower surface of the light guide plate 510 is formed to have a slope with regard to the upper surface.

The optical sheet 540 increases collecting efficiency of the light emitted from the light guide plate 510 and allows the light to have an entirely uniform distribution. The optical sheet 540 may be configured by a plurality of various sheets, and for example, may include a first diffuser sheet 542, a first prism sheet 544, a second prism sheet 546, and a second diffuser sheet 548.

A first substrate 100 and a second substrate 200 face each other and are coupled with each other to form the liquid crystal panel 300, and a liquid crystal layer is formed between the first substrate 100 and the second substrate 200. Although not shown, a plurality of gate lines, a plurality of data lines, and a thin film transistor connected therewith are formed on the first substrate 100. Further, when the thin film transistor is turned on by a signal applied from the gate line, a pixel electrode receiving the signal from the data line is formed. A common electrode may be formed on the first substrate 100 or the second substrate 200, and an electric field is formed between the pixel electrode and the common electrode to control alignment of liquid crystal molecules of the liquid crystal layer. Accordingly, the light inputted from the backlight assembly 500 is controlled to display an image.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of Symbols>

| | |
|---|---|
| 300: liquid crystal panel | 310: top chassis |
| 320: upper mold frame | 330: lower mold frame |
| 340: bottom chassis | 500: backlight assembly |
| 510: light guide plate | 512: light collection pattern |
| 520: light module | 522: printed circuit board (PCB) |

-continued

<Description of Symbols>

| | |
|---|---|
| 532: first light source | 534: second light source |
| 562: first portion | 564: second portion |
| 566: connection | 572: first protrusion |
| 574: second protrusion | 576: first space |
| 578: second space | 582: first wiring connecting member |
| 584: second wiring connecting member | 586: protruding terminal |
| 587: groove | 588: assistance connecting member |
| 592: first wiring | 594: second wiring |

What is claimed is:

1. A light module for a backlight assembly, comprising:
a printed circuit board (PCB) including a first portion and a second portion connected by a connection having a bend;
a first protrusion extending from the first portion along a length of the first portion;
a second protrusion extending from the second portion;
a first light source formed on the first portion of the printed circuit board (PCB);
a second light source formed on the second portion of the printed circuit board (PCB);
a first wiring connecting member contacting the first protrusion and connected to the first light source, the first wiring connecting member being spaced apart from the connection; and
a second wiring connecting member connected to the second light source and formed on the second portion,
wherein the first wiring connecting member and the second wiring connecting member are connected to each other by an assistance connecting member, and
wherein the first wiring connecting member, the second wiring connecting member, and the assistance connecting member are aligned on a same plane.

2. The light module of claim 1, wherein
the first portion extends substantially parallel to a longest edge of the first portion, and
the second portion extends substantially parallel to an edge of the second portion.

3. The light module of claim 2, wherein
the first wiring connecting member is formed on the first protrusion, and
the second wiring connecting member is formed on the second protrusion.

4. The light module of claim 3, wherein
the printed circuit board (PCB) further includes:
a first space formed between the first protrusion and the connection; and
a second space formed between the second protrusion and the connection.

5. The light module of claim 3, further comprising:
a first wiring connecting the first light source and the first wiring connecting member; and
a second wiring connecting the second light source and the second wiring connecting member.

6. The light module of claim 3, wherein
the second wiring connecting member further includes at least one protruding terminal protruding from one side surface, and
the first wiring connecting member includes at least one groove configured to receive the protruding terminal.

7. The light module of claim 1, wherein
the assistance connecting member is made of one of a connector, a wire, and a harness.

8. The light module of claim 3, wherein
the first wiring connecting member and the second wiring connecting member are integrally formed.

9. The light module of claim 3, wherein
the first wiring connecting member and the second wiring connecting member are made of a flexible flat cable.

10. The light module of claim 3, wherein
the first light source and the second light source include a light emitting diode (LED).

11. The light module of claim 3, wherein
an angle between the first portion and the second portion is more than 100 degrees and less than 150 degrees.

12. The light module of claim 3, wherein
the light module includes a plurality of first light sources including the first light source and a plurality of second light sources including the second light source, and
the plurality of second light sources constitutes more than 10% of the combined number of the plurality of first light sources and the plurality of second light sources.

13. A backlight assembly comprising:
a light guide plate including a side edge and a cutout portion that includes a surface that extends at an oblique angle with respect to the side edge; and
a light module positioned to face one side edge of the light guide plate and the cutout portion of the light guide plate,
wherein the light module includes:
a printed circuit board (PCB) including a first portion and a second portion connected by a connection having a bend;
a first protrusion extending from the first portion along a length of the first portion;
a second protrusion extending from the second portion;
a first light source formed on the first portion of the printed circuit board (PCB);
a second light source formed on the second portion of the printed circuit board (PCB);
a first wiring connecting member contacting the first protrusion and connected to the first light source, the first wiring connecting member being spaced apart from the connection; and
a second wiring connecting member connected to the second light source and formed on the second portion,
wherein the first portion of the printed circuit board (PCB) is positioned to face one side edge of the light guide plate,
the second portion of the printed circuit board (PCB) is positioned to face the cutout portion of the light guide plate, and
the first wiring connecting member and the second wiring connecting member are connected to each other by an assistance connecting member, and
wherein the first wiring connecting member, the second wiring connecting member, and the assistance connecting member are aligned on a same plane.

14. The backlight assembly of claim 13, wherein
the first portion extends substantially parallel to a longest edge of the first portion, and
the second portion extends substantially parallel to an edge of the second portion.

15. The backlight assembly of claim 14, wherein
the first wiring connecting member is formed on the first protrusion, and
the second wiring connecting member is formed on the second protrusion.

16. The backlight assembly of claim 15, wherein the printed circuit board (PCB) further includes:
a first space formed between the first protrusion and the connection; and
a second space formed between the second protrusion and the connection.

17. The backlight assembly of claim 15, wherein the first wiring connecting member further includes at least one protruding terminal protruding from one side surface, and
the second wiring connecting member includes at least one groove such that the protruding terminal is inserted into one side surface of the second wiring connecting member.

18. The backlight assembly of claim 15, wherein the assistance connecting member is made of one of a connector, a wire, and a harness.

19. The backlight assembly of claim 15, wherein the first wiring connecting member and the second wiring connecting member are integrally made of a flexible flat cable.

* * * * *